United States Patent
Micheloni et al.

(10) Patent No.: US 6,829,168 B2
(45) Date of Patent: Dec. 7, 2004

(54) POWER SUPPLY CIRCUIT STRUCTURE FOR A ROW DECODER OF A MULTILEVEL NON-VOLATILE MEMORY DEVICE

(75) Inventors: Rino Micheloni, Turate (IT); Giovanni Campardo, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/334,126

(22) Filed: Dec. 30, 2002

(65) Prior Publication Data

US 2003/0147290 A1 Aug. 7, 2003

(30) Foreign Application Priority Data

Dec. 28, 2001 (EP) .............................................. 01830829

(51) Int. Cl.[7] .............................................. G11C 16/04
(52) U.S. Cl. .......................... 365/185.18; 365/185.03; 365/185.13
(58) Field of Search ....................... 365/185.18, 185.03, 365/185.23, 185.13

(56) References Cited

U.S. PATENT DOCUMENTS 6,504,758 B2 * 1/2003 Sacco et al. ........... 365/185.18

FOREIGN PATENT DOCUMENTS

| EP | 1 028 433 | 8/2000 | ........... G11C/11/56 |
| EP | 1 058 271 | 12/2000 | ........... G11C/16/12 |
| EP | 1 061 525 | 12/2000 | ........... G11C/16/12 |

OTHER PUBLICATIONS

Campardo et al., "40–mm$^2$ 3–V–Only 50 MHz 64–Mb 2–b/cell CHE NOR Flash Memory", IEEE Journal of Solid–State Circuits, IEEE Inc., New York, US, vol. 35, No. 11, Nov. 2000, pp. 1655–1666, XP–001131052.

Atsumi et al., "A 3.3 V–only 16Mb Flash Memory wirh Row–Decoding Scheme", Solid–State Circuits Conference, 1996, Digest of Technical Papers. 42$^{nd}$ ISSCC 1996 IEEE Int'l San Francisco, CA, Feb. 8, 1996, pp. 42–43, XP–10156390A.

* cited by examiner

*Primary Examiner*—Huan Hoang
(74) *Attorney, Agent, or Firm*—Lisa K. Jorgenson; Allen, Dyer, Doppelt, Milbrath & Gilchrist, P.A.

(57) ABSTRACT

A power supply circuit structure is useful with a row decoder for reading/writing data from/into memory cells of an integrated electrically programmable/erasable non-volatile memory device incorporating an array of multilevel memory cells. Advantageously, multiple supply voltages to the row decoder and a switching circuit for transferring the voltages over hierarchic-mode enabled conduction paths are provided.

28 Claims, 5 Drawing Sheets

POWER SUPPLY CIRCUIT STRUCTURE FOR A ROW DECODER OF A MULTILEVEL NON-VOLATILE MEMORY DEVICE

FIELD OF THE INVENTION

The present invention broadly relates to an electronic multilevel non-volatile memory device which is monolithically integrated in a semiconductor substrate and includes a circuit structure for data programming. More particularly, the invention relates to a power supply circuit structure for a row decoder of a multilevel non-volatile memory device and the following description is given with specific reference to this field of application just for convenience of illustration.

BACKGROUND OF THE INVENTION

As is well known in this technical field, recent developments in non-volatile memories, particularly in EPROM, EEPROM and Flash-EEPROM memories, provide an increase in storage capacity by employing multilevel architectures, i.e. memory arrays whose cells can store plural logic states. A comparative review of the circuit structures of classic two-level memories may help for a better understanding of the features of this invention.

Electronic memory devices usually comprise at least one array or matrix of memory cells arranged as rows and columns. Logic information can be read/written from/to each cell by biasing a corresponding row and column.

A typical memory cell comprises a field-effect transistor having a control gate terminal, a floating gate region capacitively coupled to the control gate, a source terminal, and a drain terminal. The two possible logic states of a two-level memory cell, e.g. a logic "0" indicating a programmed cell and a logic "1" indicating an erased cell, are separated by a potential range. To discriminate the information contained in a non-volatile two-level memory it is sufficient to compare the current flowing through the memory cell with the current flowing through a reference cell that is similar in structure with the memory cell and has a known threshold voltage.

The operation allowing selection of a cell to read its information content includes applying an appropriate bias voltage to the control gate of the memory cell. If the cell has already been programmed previously, an electric charge will be found trapped in the floating gate region, and the cell threshold voltage will depress the drain current being conducted by the memory cell below that of the reference cell. On the contrary, if the cell was erased, no electric charge will be trapped in the floating gate region, and the cell conducts a drain-source current which is higher than that of the reference cell.

Thus, the most commonly used method of reading from a flash memory cell provides a comparison between the current draw from the cell to be read with the current draw from the reference cell. The comparison is performed in a simple comparator, known as a sense amplifier, which performs the comparison and outputs a corresponding result. The sense amplifier compares the current draw from the cell with the current draw from the reference cell, and accordingly converts the analog information of the addressed data into a digital form.

When a multilevel memory device must be sensed, discriminating the logic values of a cell with an n-bit storage capacity requires no less than $2^n-1$ references that may be voltage-mode or current-mode references according to the reading method implemented. For example, an approach to determining the state of an n-level memory cell is described in U.S. Pat. No. 5,774,395. Unlike a two-level memory, the reference cells of a multilevel memory require additional programming circuitry so that intermediate logic levels can be written in the reference cells for comparison with those logic levels that have been or can be programmed in the memory cell array.

Reliability considerations call for the working range of the threshold voltage to be unrelated to the number of bits contained in the cell. Therefore, the multilevel mode requires that the threshold gap between different distributions be reduced. Reducing the gap between distributions means reducing the current differentials to be detected, and this impacts the degree of accuracy demanded of the sense amplifier.

In addition, since the cell reading phase is carried out by set bias currents, any resistance that may occur in series with the source and drain terminals is bound to occasion a smaller effective gain of the cell, and hence a reduced current dynamic range. Thus, to maintain a current reading mode, all the effects of series resistance should be reduced or minimized, and this is achieved by reading a cell with a number of gate voltages. However, a problem that arises directly from this procedure is that of the row voltage switching time. In general, row voltage is conveyed over the power supply of the row decoder.

Thus, varying the row voltage means varying the power supply of the row decoder or portion thereof. Since the parasitic capacitance that is associated with the row decoder is about hundreds of picoFarads (pF), it will be appreciated that this prior technique expands the reading time to an unacceptable extent.

At present, a standard access time is about a hundred nanoseconds (ns) even for a multilevel memory. Shifting in voltage a capacitance of hundreds of pF with the precision that the multilevel mode requires would extend the reading time by some microseconds ($\mu$s). In an effort to obviate such drawbacks, the state of the art provides a special row decoding structure that comprises a plurality of main row decoders for generating first and second control signals, and a plurality of local row decoders for responding to the first and second control signals with the generation of a wordline selecting signal. This is the structure described, for instance, in the U.S. Pat. No. 6,064,023.

While being advantageous on several counts, the above structure does not prove capable of generating at any particularly high rate the positive and negative voltage values that are needed for programming and erasing the memory cells.

SUMMARY OF THE INVENTION

An object of the present invention is to provide a power supply circuit structure for a row decoder, which can bring the time for switching between the different gate voltages down, such as to the time constant of the array row.

A further object of the invention is that of providing a reading process that is simple, controlled, and highly accurate for reading the reference cells of a multilevel memory.

Another object of the invention is that of keeping the programming time of the reference cells substantially the same for all the array sections.

These and other objects are obtained by providing a plurality of supply voltages to the row decoder, and applying such voltages through conduction paths that are enabled similarly as in a hierarchic decoding. The invention relates to a power supply circuit structure for a row decoder of a multilevel non-volatile memory device including a matrix of memory cells and associated reading and programming circuits, wherein the memory device comprises multiple supply voltages for the row decoder, and a switching circuit or switching means for transferring the voltages through conduction paths that are enabled according to a hierarchic-mode decoding system.

BRIEF DESCRIPTION OF THE DRAWINGS

The features and advantages of the supply circuit structure according to the invention can be better appreciated from the following description of an embodiment thereof, given by way of non-limiting example with reference to the accompanying drawings. In the drawings.

DETAILED DESCRIPTION OF THE PREFERRED EMBODIMENTS

With reference to the drawings, shown generally at 1 is a power supply circuit structure embodying this invention, for use with a row decoder 2 incorporated in a non-volatile memory device that comprises a multilevel memory cell array or matrix MAT. The whole of the circuit structure 1 is to be seen in a combination of the FIGS. 1A and 1B, which have been drawn separate for practical reasons. The memory cells are omitted because they are plainly conventional.

Figure 1:
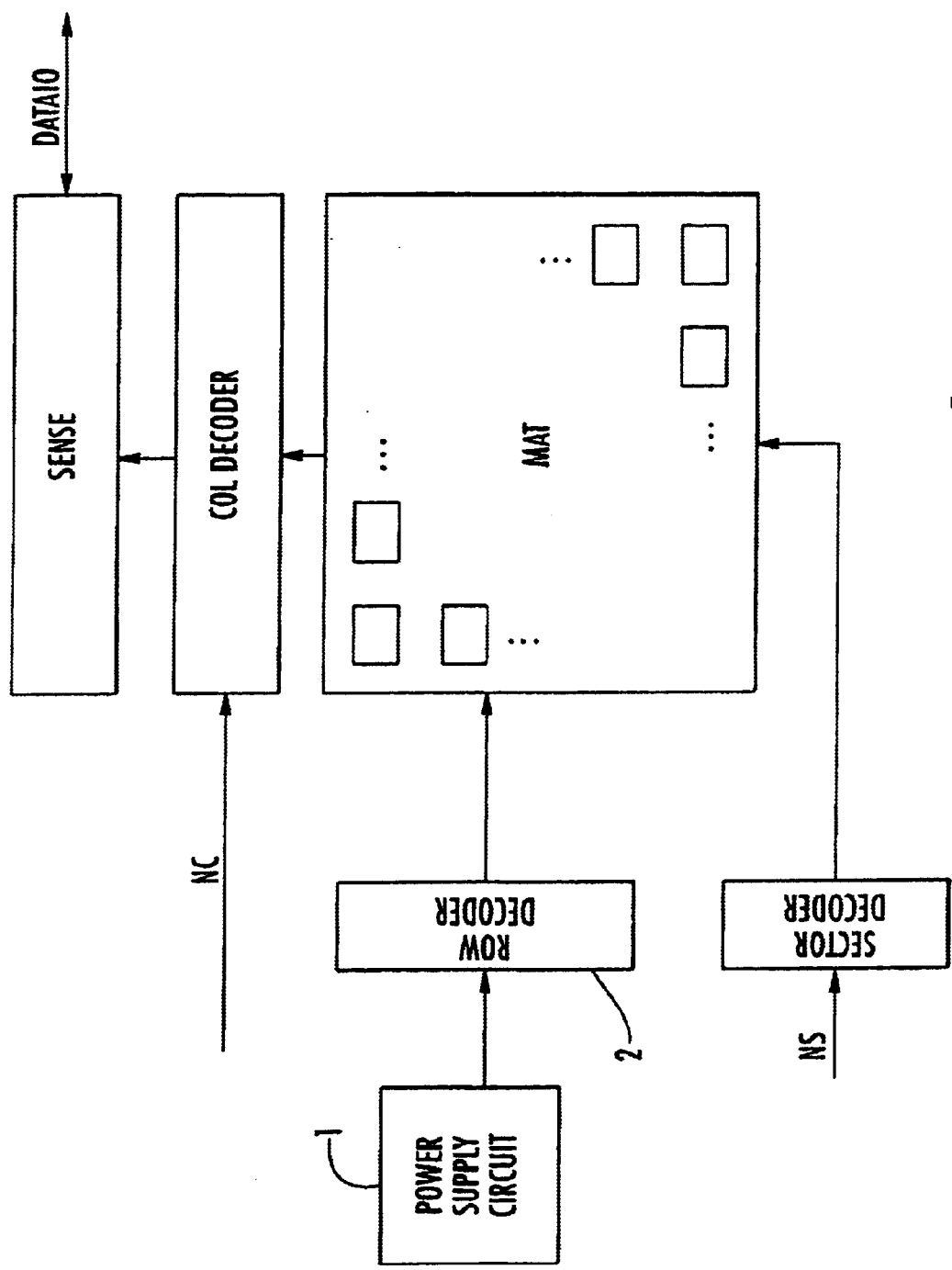
FIG. 1 shows a schematic view of a multilevel non-volatile memory device including a matrix of memory cells, row and column decoders and a power supply circuit according to the present invention.
Figure 1A:
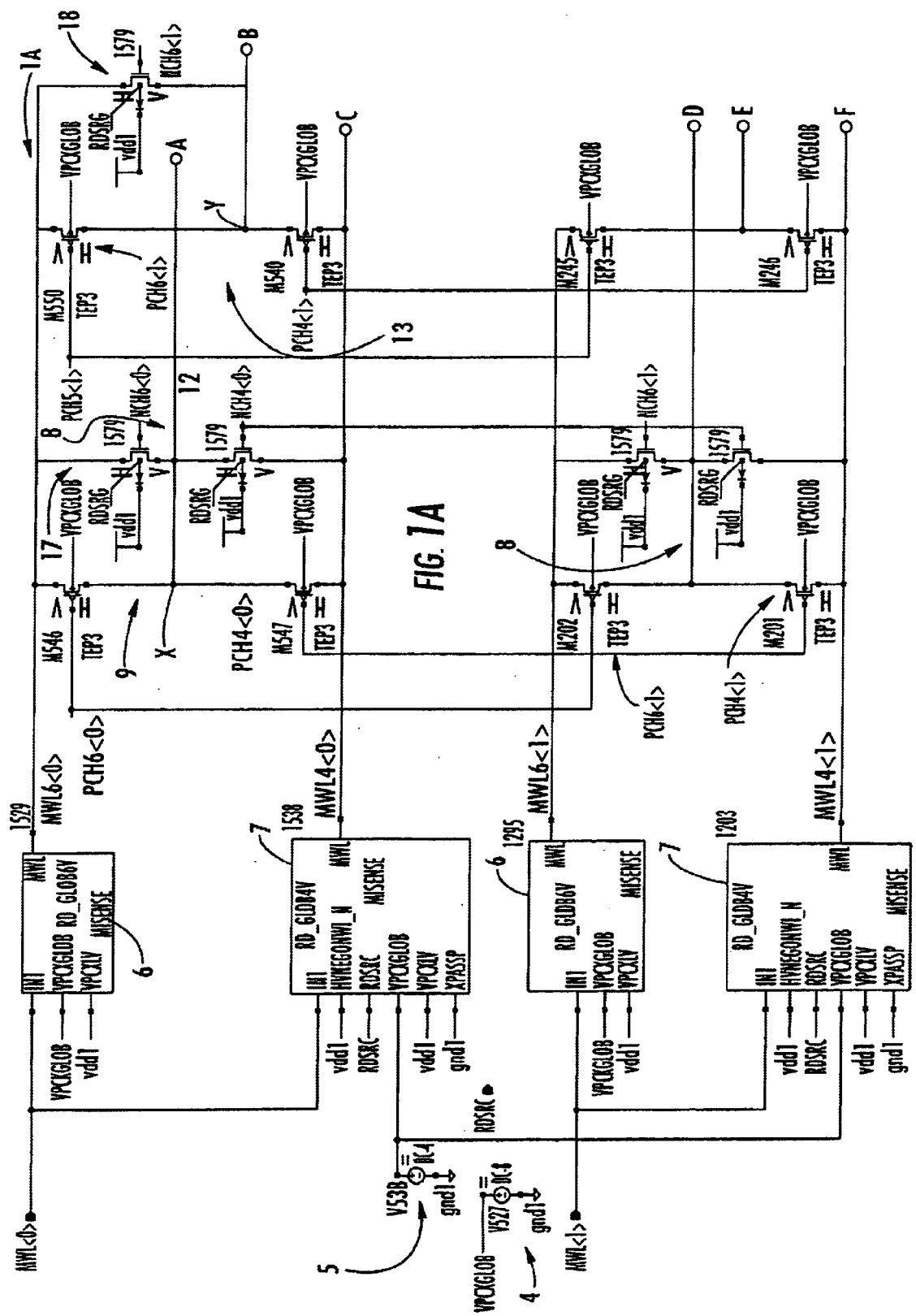
FIG. 1A shows a schematic view of a portion of a power supply circuit structure embodying this invention for a row decoder of an electrically programmable and erasable memory device that incorporates a multilevel memory cell array.
Figure 1B:
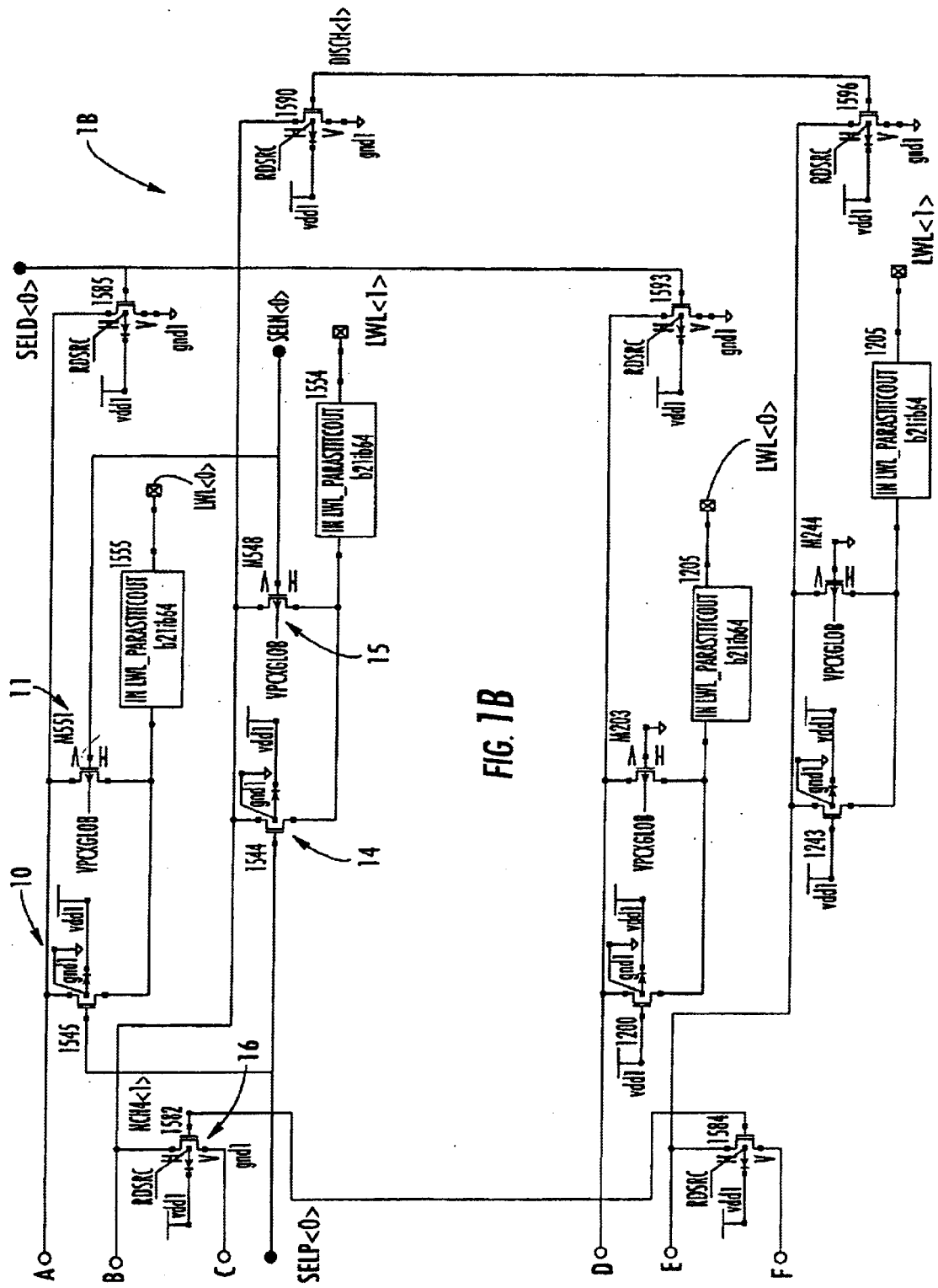
FIG. 1B shows a schematic view of a further portion of the power supply circuit structure of FIG. 1A.

As may be appreciated the circuit nodes A, B, C, D, E and F in FIG. 1A correspond to the same circuit nodes of FIG. 1B. The memory device is monolithically integrated in a semiconductor substrate and designed to be electrically programmed and erased. For example, the memory device may be an EEPROM or a Flash-EEPROM memory. Furthermore, this memory device may be a single supply or a double supply device. In any event, the same considerations as are made here below would hold with any other types of EEPROMs or flash memories, including EPROMs.

The memory array is organized in rows, or wordlines WL, and columns, or bitlines BL. Each cell comprises a floating gate transistor having a drain region and a source region, these regions being both formed on a semiconductor substrate, and separated by a channel region. The floating gate is formed on top of the substrate and separated from the latter by a thin layer of gate oxide. A control gate is capacitively coupled to the floating gate through a dielectric layer. The control gate is the control terminal of the transistor, while the drain and source terminals form conduction terminals.

Preferably, the memory cell array is divided into a plurality of sectors that can be electrically programmed, even by a single byte. The row decoders 2 shown schematically in FIG. 1 are each associated to a corresponding matrix sector.

As is well known, all the memory cells of a given wordline WL share the electrical line used for driving their respective control gates, while all the memory cells of a given bitline BL have the drain terminals in common. The source terminals of all the memory cells are connected to one potential reference, such as a ground reference potential GND.

When applying appropriate voltage values to the terminals of a memory cell, the cell state is to be changed by varying the amount of charge in the floating gate. The operation for storing a charge into the floating gate is referred to as "programming", and includes biasing the control gate and drain terminal to a predetermined higher voltage value than the potential on the source terminal.

A flash memory may be programmed either in a sector by sector mode (page mode) or in a byte by byte mode (byte mode). In the page mode, all the cells in one row are addressed simultaneously. In the byte mode, a single byte is addressed from the many that are available in a row.

It should be further added that to erase a flash memory cell, its source terminal receives a voltage approximately equal to the program voltage, its drain terminal is floated, and its control gate is connected to ground or to a negative voltage reference. The erasing phase can be performed either by sectors or by byte.

As to the reading operation, the current drawn by a memory cell is merely compared with that drawn by a reference cell, the latter being usually a virgin cell with the same structure of a memory cell.

Advantageously, according to the invention, to speed up the programming and reading phases of the multilevel cells, the row decoder 2 is supplied by a plurality of supply voltages that are transferred by a switch circuit or switch means over conduction paths that are enabled as in hierarchic decoding system. For this purpose, at least first and second voltage generators 4, 5 are arranged to produce predetermined different voltage values to be used during the programming and/or reading phases of the memory cells. In a preferred embodiment, the first generator 4 generates a 6 V potential, and the second generator 5 generates a 4 V potential. Each voltage generator may be realized for instance by a charge pump voltage shifter.

As shown in FIG. 1A, circuit nodes MWL<0>, MWL<1>, ..., MWL<i> are provided that may receive signals for directly addressing the matrix rows, e.g. of polysilicon, or the main wordline of a hierarchic decoding arrangement.

Each node MWL<i> is coupled to an input IN1 of a first selector 6 receiving as inputs other voltage signals, such as a supply voltage Vdd and the voltage from generator 4, or a program voltage Vpcx.

The node MWL<i> is also coupled to an input IN1 of a second selector 7 further receiving another set of voltage signals, such as the supply voltage Vdd, a ground reference GND, a voltage from the second generator 5, and a reference potential RDSRC from an enable circuit. This potential RDSRC is normally a ground potential, but may be shifted to a negative voltage level when an erasing phase is required using negative voltages.

The output from the first selector 6 should be regarded as a power supply of a higher level, while the output from the second selector 7 should be regarded as a power supply of a lower level. A voltage decoding structure 8 is provided downstream of the selectors 6, 7 for transferring the upstream voltage levels onto corresponding nodes A, B, C and D, according to reading, programming or erasing phases to be performed. Those nodes A, B G, C and D may be polysilicon wordlines of the main wordline signals of a hierarchic row decoding.

In the structure 8 a hierarchic switch 9 is used comprising first and second P-channel transistors, receiving the signals PCH6(0) and PCH4(0), connected in series between the output of the first selector 6 and the output of the second selector 7. The interconnecting node X between the transistors PCH6(0) and PCH4(0) is coupled to a local wordline LWL<0> through a pair of switches 10, 11 that are local selectors of a hierarchic row decoding.

In other words, the node A is a main wordline to which a plurality of local wordlines may be associated. Preferably four local wordlines can be associated to the main wordline, but just a single local wordline is shown in the drawings for simplicity of representation.

An N-channel transistor 12, receiving the signal NCH4 (0), further connects the node X to the output line of the second selector 7. This transistor 12 is used to pass negative voltages on the nodes A, B, D and E, since PMOS transistor are not useful to transfer negative voltages if not reaching negative voltages lower than the gate voltage.

A further N-channel transistor 17 is parallel connected to the P-Channel transistor PCH6<0> and is driven by the N-channel transistor 12. These N-channel transistor are used to pass negative voltages or to keep some rows unselected, thus connected to ground or to a negative voltage potential. For instance, when performing a verify phase, negative voltages (−2 V) are applied to the unselected rows.

Figure 2:
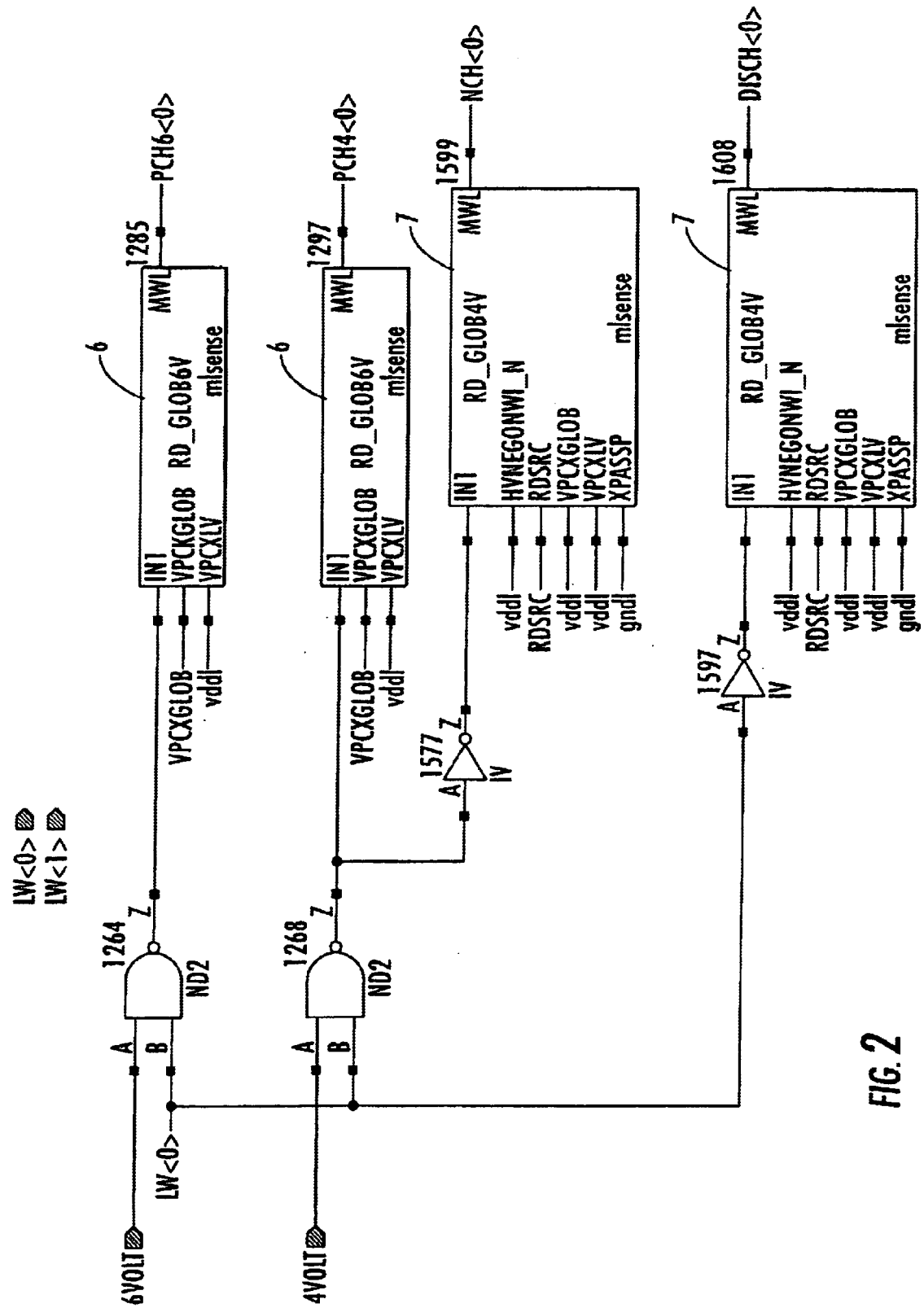
FIG. 2 shows a schematic view of another portion of the circuit structure according to the invention.

The power supplies to transistors PCH6(0), PCH4(0), 12 and 17 are independent of one another and obtained from scheme that is similar to the one disclosed with reference to the main wordline MWL and shown in FIG. 2. A mirror-image hierarchic switch structure 13 is associated to the above structure 8, and comprises a pair of P-channel transistors receiving the signals PCH6(1), PCH4(1) and connected in series between the output of the first selector 6 and the output of the second selector 7 in parallel with the structure 8.

In a similar way, a second local wordline LWL<1> is coupled to an interconnecting node Y between the transistors PCH6(1) and PCH4(1) of the second structure 13 through a pair of switches 14, 15 that are enabled by a signal SELP<0> and SELN<0>, respectively. An N-channel transistor 16, receiving the signal NCH4(1), further connects the node Y to the output line of the second selector 7. The N-channel MOS transistors of the portions 8 and 13 have well regions biased by this signal RDSRC.

Figure 3:
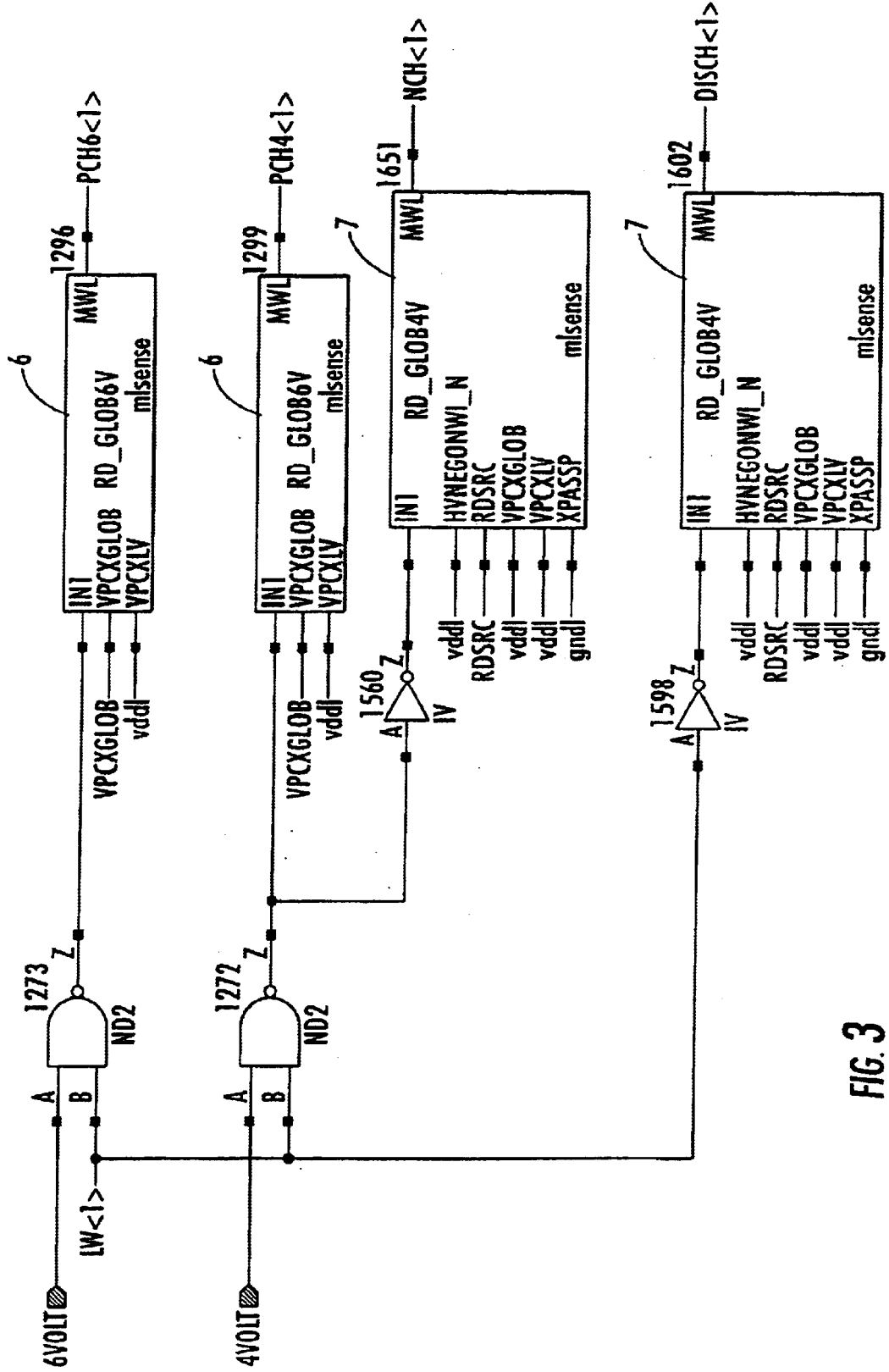
FIG. 3 shows a schematic view of a further portion of the circuit structure according to the invention.

A further N-channel transistor 18 is parallel connected to the P-channel transistor PCH6<1> and is driven by the N-channel transistor 16. These N-channel transistors 16, 18 are used to pass negative voltages or to keep some rows unselected, thus connected to ground or to a negative voltage potential. Again, the power supplies to the transistors PCH6 (1), PCH4(1), 16 and 18 are independent of one another and obtained from a hierarchic voltage selection structure that is similar to the one discussed previously for the main wordline MWL and shown in FIG. 3.

The foregoing considerations apply irrespectively of which structure is chosen for transferring the voltage levels to the local wordline from the main wordline. Of significance is that a hierarchic power supply structure has been provided, whereby the voltage levels needed for memory read/write operations are available directly.

For example, there is no reason why a single p-channel transistor could not be used as the hierarchic level transfer structure. Actually, as is typical of a hierarchic setup, a more complex switch must be provided in order not to let some nodes float. A practical switch would usually comprise both an N-channel and a p-channel transistor.

For completeness, the mechanisms underlying the operation of programming a multilevel memory will be reviewed here below to promote a thorough understanding of how the teachings of this invention also apply to the programming operation.

The degree of accuracy needed for managing multilevel memories is not limited to the reading operation. A programming mechanism is also required by which information can be correctly located within different threshold distributions of the cells. The writing mechanism commonly employed in flash memory with NOR architecture is that of the hot electrons. By applying a potential of about 10 V to the control gate and a voltage of about 5 V to the drain terminal while leaving the source connected to ground, a strong electric field can be generated between the isolated gate and the channel at the same time as a large current is produced between the source and the drain. This allows the electrons that are acquired from the channel along the source-to-drain path to reach the floating gate over the potential barrier of the tunnel oxide.

This is a self-limiting process. The negative charge that is built up in the floating gate depress the electric field originally created, thereby inhibiting the element that promoted the phenomenon. The advantages of a multilevel memory operation are accompanied by problems from a reduced difference between the threshold voltages corresponding to the different charge levels that can be stored into the floating gate, and therefore between the different conduction levels of the cells. Programming a multilevel memory cell involves controlling the charge stored in the floating gate region with the utmost accuracy.

In view of an article, "Nonvolatile multilevel memories for digital applications" by B. Riccò G. Torelli, M. Lanzoni, A. Manstretta, H. E. Maes, D. Montanari and A. Morelli, Proc. IEEE, Vol. 86, pages 2399–2421, Dec. 1998, having demonstrated experimentally and justified theoretically that a linear relation can be established between the variation $\Delta Vg$ of the voltage applied to the gate during the programming operation and the threshold jump obtained at set values of vd and Vs, the cell is programmed by applying to its gate a voltage that increases linearly stepwise. In essence, each program pulse is to differ from the preceding and the following one by a constant value $\Delta Vg$.

Thus, the gate program voltage has the appearance of constant-pitch stairs. In particular, a remarkable consequence of using this method is that the width of the threshold voltage distribution is equal to the pitch of the stairs voltage applied, when all the effects of retention, temperature variation, etc. are neglected. Accordingly, the best way of programming the memory cells at the desired voltage value, using a minimum of pulses, is provided by this regularly stepped gate voltage.

However, the above-described mechanism is inherently slowed by the need to have a succession of pulses delivered to the gate terminal of the cell. To achieve a single-byte programming time that compares well with that of a conventional two-level cell, several cells have to be programmed in parallel. For example, assume the programming time of a single byte to be 6 $\mu$s in the instance of two-level cells; then, since going through the programming stairs takes 200 μs, 256 bits will have to be programmed simultaneously to achieve an effective programming time of 6 μs per byte.

The present trend in favor of having the performance of NOR-type flash memories approach that of NAND-type ones, is urging us to shorten this programming time, in view of that the hot-electron injection mechanism cannot help using up several tens of μA per cell. Assume now that only the current required for programming 64 cells and a 256-bit write page (write buffer) is available.

The possible programming operations would be:

1. applying two program pulses, each for a duration time of 1.5 μs (the pulse duration being dependent on the physical characteristics of the cells);
2. bitline discharging—0.5 μs;
3. row-decoding supply transition from the program voltage to the verify voltage—2 μs duration;
4. two verify operations totaling 1 μs; and
5. verify voltage transition to the next program operation—2 μs.

Therefore, each program pulse requires 8.5 μs. This procedure is repeated at each operation, 23 times in this case. Notice that one half of this time is expended to the row-decoding supply transitions, not to any physical characteristics of the cell. In the method of this invention, row-decoding transition time is brought down to a few tens of ns by the voltage levels required for programming being already available directly from the local wordlines.

Assume now the instance of the reading being effected at a single supply voltage. In this case, two power supplies would have to be provided: one for the read voltage and one on which the programming operation is to be passed. At the end of the program pulse, decoding is changed over to the verify voltage; the programming operation is updated in parallel.

The circuit structure of the invention does address the technical problem and affords a number of advantages. Foremost among these is that it provides a reading process that is a simple, controlled, and highly accurate process for reading the reference cells of a multilevel memory. This is achieved for a reduced or minimum of area occupation and circuit complexity.

Furthermore, the programming time of the reference cells is kept substantially the same for all the array sections. Skilled persons in the art will recognize that changes and modifications can be made unto the circuit structure of the invention within the scope of the following claims.

What is claimed is:

1. A power supply circuit structure for a row decoder of a multilevel non-volatile memory device including a matrix of memory cells and associated reading and programming circuits, the power supply circuit structure comprising:
    a plurality of supply voltage generators for generating a plurality of supply voltages;
    a plurality of conduction paths that are enabled according to hierarchic-mode decoding; and
    a switching circuit for transferring the plurality of supply voltages through said plurality of conduction paths.

2. A power supply circuit structure according to claim 1 wherein said plurality of conduction paths comprise hierarchic levels of wordlines for receiving the supply voltages to bias the memory cells to a higher or lower level.

3. A power supply circuit structure according to claim 2 wherein said switching circuit comprises a hierarchic switch structure connected between said hierarchic levels of wordlines and being independently enabled by respective enabling signals.

4. A power supply circuit structure according to claim 3 wherein the hierarchic levels of wordlines comprise main wordlines and local wordlines; and wherein said hierarchic switch structure comprises a plurality of hierarchic switches, each comprising at least one pair of P-channel transistors connected in series between a respective main wordline and a respective local wordline.

5. A power supply circuit structure according to claim 4 wherein said at least one pair of P-channel transistors define a node therebetween that is coupled to the respective local wordline.

6. A power supply circuit structure according to claim 1 wherein said switching circuit further comprises a plurality of supply voltage selectors receiving as inputs additional voltage references; and wherein said plurality of supply voltage generators comprises at least first and second voltage generators structurally independent from one another and associated with respective supply voltage selectors.

7. A power supply circuit structure according to claim 6 wherein said plurality of supply voltage selectors comprises transistor switches coupling respective voltage outputs to respective local wordlines.

8. A memory device comprising:
    a matrix of multilevel memory cells;
    a row decoder connected to said matrix of multilevel memory cells;
    a power supply circuit structure for said row decoder comprising
    a plurality of supply voltage generators for generating a plurality of supply voltages,
    a plurality of conduction paths that are enabled according to hierarchic-mode decoding, and
    a switching circuit for transferring the plurality of supply voltages through said plurality of conduction paths.

9. A memory device according to claim 8 wherein said plurality of conduction paths comprise hierarchic levels of wordlines for receiving the supply voltages to bias the multilevel memory cells to a higher or lower level.

10. A memory device according to claim 9 wherein said switching circuit comprises a hierarchic switch structure connected between said hierarchic levels of wordlines and being independently enabled by respective enabling signals.

11. A memory device according to claim 10 wherein the hierarchic levels of wordlines comprise main wordlines and local wordlines; and wherein said hierarchic switch structure comprises a plurality of hierarchic switches, each comprising at least one pair of P-channel transistors connected in series between a respective main wordline and a respective local wordline.

12. A memory device according to claim 11 wherein said at least one pair of P-channel transistors define a node therebetween that is coupled to the respective local wordline.

13. A memory device according to claim 8 wherein said switching circuit further comprises a plurality of supply voltage selectors receiving as inputs additional voltage references; and wherein said plurality of supply voltage generators comprises at least first and second voltage generators structurally independent from one another and associated with respective supply voltage selectors.

14. A memory device according to claim 13 wherein said plurality of supply voltage selectors comprises transistor switches coupling respective voltage outputs to respective local wordlines.

15. A memory device comprising:
    a matrix of memory cells;

a decoder connected to said matrix of memory cells; and a power supply circuit structure for said decoder comprising a plurality of supply voltage generators for generating a plurality of supply voltages, and a switching circuit for transferring the plurality of supply voltages through a plurality of conduction paths that are enabled according to hierarchic-mode decoding.

16. A memory device according to claim 15 wherein the plurality of conduction paths comprise hierarchic levels of wordlines for receiving the supply voltages to bias the memory cells to a higher or lower level.

17. A memory device according to claim 16 wherein said switching circuit comprises a hierarchic switch structure connected between said hierarchic levels of wordlines and being independently enabled by respective enabling signals.

18. A memory device according to claim 17 wherein the hierarchic levels of wordlines comprise main wordlines and local wordlines; and wherein said hierarchic switch structure comprises a plurality of hierarchic switches, each comprising at least one pair of P-channel transistors connected in series between a respective main wordline and a respective local wordline.

19. A memory device according to claim 18 wherein said at least, one pair of P-channel transistors define a node therebetween that is coupled to the respective local wordline.

20. A memory device according to claim 15 wherein said switching circuit further comprises a plurality of supply voltage selectors receiving as inputs additional voltage references; and wherein said plurality of supply voltage generators comprises at least first and second voltage generators structurally independent from one another and associated with respective supply voltage selectors.

21. A memory device according to claim 20 wherein said plurality of supply voltage selectors comprises transistor switches coupling respective voltage outputs to respective local wordlines.

22. A method of powering a decoder for a memory device including a matrix of memory cells, the method comprising:

generating a plurality of supply voltages using a plurality of supply voltage generators; and transferring the plurality of supply voltages through a plurality of conduction paths that are enabled according to hierarchic-mode decoding using a switching circuit.

23. A method according to claim 22 wherein the plurality of conduction paths comprise hierarchic levels of wordlines for receiving the supply voltage values to bias the memory cells to a higher or lower level.

24. A method according to claim 23 wherein transferring comprises using a switching circuit including a plurality of supply voltage selectors receiving as inputs additional voltage references; and wherein generating the plurality of supply voltages comprises using at least first and second voltage generators structurally independent from one another and associated with respective supply voltage selectors.

25. A method according to claim 24 wherein the switching circuit comprises a hierarchic switch structure connected between said hierarchic levels of wordlines and being independently enabled by respective enabling signals.

26. A method according to claim 25 wherein the hierarchic levels of wordlines comprise main wordlines and local wordlines; and wherein the hierarchic switch structure comprises a plurality of hierarchic switches, each comprising at least one pair of P-channel transistors connected in series between a respective main wordline and a respective local wordline.

27. A method according to claim 26 wherein said at least one pair of P-channel transistors define a node therebetween that is coupled to the respective local wordline.

28. A method according to claim 24 wherein the plurality of supply voltage selectors comprises transistor switches coupling respective voltage outputs to respective local wordlines.

* * * * *